United States Patent
Jayapal et al.

(10) Patent No.: US 9,905,560 B2
(45) Date of Patent: Feb. 27, 2018

(54) MULTI-VOLTAGE COMPLEMENTARY METAL OXIDE SEMICONDUCTOR INTEGRATED CIRCUITS BASED ON ALWAYS-ON N-WELL ARCHITECTURE

(71) Applicant: MediaTek Singapore Pte. Ltd., Singapore (SG)

(72) Inventors: Senthilkumar Jayapal, Singapore (SG); Navienkumar Ramachandran Arumugam, Singapore (SG)

(73) Assignee: MEDIATEK SINGAPORE PTE. LTD., Singapore (SG)

( * ) Notice: Subject to any disclaimer, the term of this patent is extended or adjusted under 35 U.S.C. 154(b) by 8 days.

(21) Appl. No.: 14/983,796

(22) Filed: Dec. 30, 2015

(65) Prior Publication Data
US 2016/0111424 A1    Apr. 21, 2016

Related U.S. Application Data

(60) Provisional application No. 62/166,854, filed on May 27, 2015.

(51) Int. Cl.
*H01L 23/528*    (2006.01)
*H01L 27/092*    (2006.01)
(Continued)

(52) U.S. Cl.
CPC ...... *H01L 27/0921* (2013.01); *H01L 27/0207* (2013.01); *H01L 27/092* (2013.01);
(Continued)

(58) Field of Classification Search
CPC ............. H01L 27/0921; H01L 27/0928; H01L 21/823878; H01L 21/823892;
(Continued)

(56) References Cited

U.S. PATENT DOCUMENTS 4,791,316 A * 12/1988 Winnerl .................. G05F 3/205
                                                        257/372
5,994,744 A * 11/1999 Katayama ........... H01L 27/0251
                                                        257/298
(Continued)

FOREIGN PATENT DOCUMENTS

TW    498498    8/2002

OTHER PUBLICATIONS

Standard cell libraries with various driving strength cells for 0.13, 0.18 and 0.35 µm technologies; Hashimoto, M.; Fujimori, K.; Onodera, Hidetoshi; Design Automation Conference, 2003.
(Continued)

*Primary Examiner* — Marcos D Pizarro Crespo
*Assistant Examiner* — Long H Le
(74) *Attorney, Agent, or Firm* — Han IP Corporation; Andy M. Han

(57) ABSTRACT

Examples of multi-voltage (MV) complementary metal oxide semiconductor (CMOS) integrated circuits (ICs) based on always-on N-well architecture are described. A MV CMOS IC may include first CMOS cells, second CMOS cells, N-wells and always-on taps. Each first CMOS cell may have a supply terminal configured to receive a local supply voltage, and an N-well (NW) terminal configured to receive a global supply voltage. The second CMOS cells may include always-on CMOS cells. Each second CMOS cell may have a supply terminal configured to receive the global supply voltage, and an NW terminal configured to receive the global supply voltage. The NW terminal of at least one of the second CMOS cells and the NW terminal of at least one of the first CMOS cells may be formed in a first N-well of the one or more N-wells.

11 Claims, 15 Drawing Sheets

(51) Int. Cl.
  *G06F 17/50* (2006.01)
  *H01L 27/02* (2006.01)
  *H01L 27/118* (2006.01)
  *H01L 21/8238* (2006.01)
(52) U.S. Cl.
  CPC .............................. *H01L 27/11807* (2013.01); *H01L 21/823892* (2013.01); *H01L 2027/11851* (2013.01)
(58) Field of Classification Search
  CPC . H01L 21/761; H01L 27/0207; H01L 27/092; H01L 27/11807
  See application file for complete search history.

(56) References Cited

U.S. PATENT DOCUMENTS

| | | | |
|---|---|---|---|
| 2005/0041346 A1* | 2/2005 | Wu | H01L 27/0285 361/56 |
| 2008/0127000 A1 | 5/2008 | Majumder et al. | |
| 2014/0027810 A1* | 1/2014 | Yang | H01L 27/0921 257/133 |
| 2016/0079162 A1* | 3/2016 | Hsieh | H01L 27/0207 257/288 |

OTHER PUBLICATIONS

Proceedings of the ASP-DAC 2003. Asia and South Pacific DOI: 10.1109/ASPDAC.2003.1195092; Publication Year: 2003, pp. 589-590.

Optimization of standard cell libraries for low power, high speed, or minimal area designs; Fisher, C.; Blankenship, R.; Jensen, J.; Rossman, T.; Svilich, K.; Custom Integrated Circuits Conference, 1996; Proceedings of the IEEE 1996 DOI: 10.1109/CICC.1996. 510604; Publication Year: 1996, pp. 493-496.

Taiwan Intellectual Property Office, Office Action regarding Taiwan Patent Application No. 105116776, dated Oct. 5, 2016.

* cited by examiner

MULTI-VOLTAGE COMPLEMENTARY METAL OXIDE SEMICONDUCTOR INTEGRATED CIRCUITS BASED ON ALWAYS-ON N-WELL ARCHITECTURE

CROSS REFERENCE TO RELATED PATENT APPLICATION

The present disclosure claims the priority benefit of U.S. Provisional Patent Application No. 62/166,854, filed on 27 May 2015, which is incorporated by reference in its entirety.

TECHNICAL FIELD

The present disclosure is generally related to complementary metal oxide semiconductor (CMOS) integrated circuits (ICs) and, more particularly, to a multi-voltage (MV) CMOS IC using an always-on N-well architecture.

BACKGROUND

It is of ultimate importance for portable or mobile electronic systems to have a battery life that sustains a reasonably long period of time, typically for hours but sometimes for days or even weeks, between a battery charging event and the next. For this purpose, contemporary CMOS ICs employed by such a portable system often resort to advanced power management schemes that include durations of operation called "partial power down" (PPD). During PPD, portions of the system (that is, some domains of the CMOS system) that are not in use, typically called "power down (PD) domains", are powered down to reduce standby power consumption. The terms "CMOS IC" and "CMOS system" are used interchangeably herein.

When a domain of a CMOS IC is powered down during PPD, some devices in the PD domain may need to continue operating, or remain "on", while other CMOS devices if the domain is powered down. These devices that remain "on" are called "always-on" (AON) cells. Typically, the AON cells operate from a supply voltage different from the supply voltage from which other CMOS cells that are powered down during PPD operate from. FIG. 12 is a schematic diagram of a portion 1200 of such a PD domain implemented in a conventional way. Specifically, the PD domain includes a regular CMOS cell 1210 that is configured to be powered down during PPD and a CMOS AON cell 1220 that is configured to remain operating during PPD. As shown in FIG. 12, CMOS cell 1210 has its p-type metal oxide semiconductor (PMOS) source terminal 1211 connected to a supply voltage "local VDD" that is configured to be disabled to the PD domain during PDD. On the other hand, CMOS cell 1220 has its PMOS source terminal 1221 connected to a supply voltage "global VDD" that is configured to stay on and available to the PD domain during PDD. Conventionally, a PMOS device of a CMOS cell is connected in a "local tie" configuration; that is, the body terminal of the PMOS device of the CMOS cell (i.e., the N-well terminal of the CMOS cell) is connected together with the source terminal of the PMOS device. Therefore, in a conventional implementation of a PD domain having an AON cell as shown in FIG. 12, CMOS cell 1210 has its NW terminal connected to the local VDD, whereas CMOS cell 1220 has its NW terminal connected to the global VDD.

The local VDD and the global VDD may have different voltage levels. Namely, the N-well (NW) of CMOS cell 1210 may be biased at a different voltage level than the NW of CMOS cell 1220. It is well known in the art that when two NWs biased at different voltage levels are manufactured on the same semiconductor substrate, the two NWs cannot be placed side-by-side and abutting with each other. Instead, certain NW-to-NW spacing is required between the two NWs so that they can be manufactured properly.

FIG. 13 illustrates a physical realization 1300 of the two CMOS cells in the schematic diagram of FIG. 12 may be physically realized on a semiconductor substrate. As can be seen in FIG. 13, each of the two CMOS cells has a respective NW, one biased to the local VDD and the other biased to the global VDD. Specifically, each of NW terminal 1351 and supply terminal 1361 of regular CMOS cell 1310 is connected to the local supply that is to be disabled during PPD, while each of NW terminal 1352 and supply terminal 1362 of AON CMOS cell 1320 is connected to the global supply that remains available during PPD. N-well 1342 of the AON cell is biased at the voltage level of global VDD through NW terminal 1352 for both normal operation periods and partial power down periods. On the other hand, N-well 1341 of the regular cell is biased at the voltage level of local VDD through NW terminal 1351 only during normal operation. Notably, the two NWs do not abut against each other, as the global VDD may be at a different voltage level than the local VDD. Instead, a NW-to-NW spacing 1380 is required between the two NWs.

To ensure a proper NW-to-NW spacing is presented between two separate N-wells, a NW-to-NW spacing design rule is typically imposed by a semiconductor manufacturer (the "foundry"). The design rule is necessary to guarantee the quality of the manufactured semiconductor chips. A foundry manufactures a semiconductor chip according to a database containing a physical description of the intended semiconductor circuitry. This database is presented by 2-dimensional (2D) layout design files describing how the semiconductor circuitry is intended to be physically made. The layout may include dimension and connection information of the CMOS cells forming the circuitry. Before the foundry actually start to transform the semiconductor design into a physical product, the foundry would use a set of so-called "design rules" to check the layout database of the design to make sure the physical design according to the layout database can be faithfully and satisfactorily realized via its manufacturing process. A checking of the NW-to-NW spacing is included in the design rules, and the physical layout has to pass the checking to ensure the required NW-to-NW spacing is not accidentally omitted.

Conventionally, on the design end, NW-to-NW spacing is included in an AON cell layout to ensure the design rule check (DRC) of the NW spacing is fulfilled. FIG. 14 is an illustration of a 2D layout 1400 of a conventional AON cell. As can be seen in FIG. 14, NW spacing 1420 and NW spacing 1430 (that is, unutilized silicon areas containing no N-well) are included in the layout on both the left and right sides of the layout. Therefore, when put together with other CMOS cells of a PD domain, NW-to-NW spacing is naturally guaranteed between separate N-wells 1510, 1520, 1530, 1540, 1550 and 1560 in the overall 2D layout of the PD domain, such as the 2D layout 1550 of a MV CMOS IC shown in FIG. 15. 2D layout 1400 of the conventional AON cell also includes at least one always-on tap (ATAP) 1440 that is disposed in NW 1410 and configured to be connected to global supply so as to bias NW 1410 to the voltage level of global VDD. In addition, local VDD metal stripe 1450 and ground (VSS) metal stripe 1460 are also included in 2D layout 1400 of the conventional AON cell so as to facilitate abutment against adjacent CMOS cells, even though local VDD metal stripe 1450 is not electrically part of the conventional AON cell.

As CMOS manufacturing technologies evolve and improve from generation to generation, physical sizes of CMOS transistors and cells, or "gates", are greatly reduced. The technology improvement gives rise to highly integrated CMOS ICs and systems that pack millions or even trillions of gates on a small piece of semiconductor substrate. Unfortunately, however, the required NW-to-NW spacing does not scale down at the same rate as the CMOS devices. As a result, a higher and higher percentage of precious substrate real estate is occupied by the required NW-to-NW spacing around the AON cells. The NW-to-NW spacing do not actively contribute to the functionalities of the CMOS system, and thus are considered an overhead of the system. Take the AON cell of FIG. 15 as an example, the AON cell layout may be 3.78 μm in total width, representing a buffer cell in a 28 nm process. The NW spacing on both the left and right side of the cell of FIG. 15 may collectively take up 45% of the cell width, which translates to 45% of the cell area. In view of FIG. 15 where AON cells and regular cells are put together, significant silicon area is also taken by the NW spacing around the AON cells.

SUMMARY

The following summary is illustrative only and is not intended to be limiting in any way. That is, the following summary is provided to introduce concepts, highlights, benefits and advantages of the novel and non-obvious techniques described herein. Select implementations are further described below in the detailed description. Thus, the following summary is not intended to identify essential features of the claimed subject matter, nor is it intended for use in determining the scope of the claimed subject matter.

An objective of the present disclosure is to provide schemes, techniques, apparatuses and methods for implementing an always-on N-well (NW) architecture in a multi-voltage (MV) complementary metal oxide semiconductor (CMOS) integrated circuit (IC). The MV CMOS IC may include various CMOS library cells, and each of the CMOS library cells may operate from a different supply voltage. Each library cell has one or more p-type metal oxide semiconductor (PMOS) devices and one or more n-type metal oxide semiconductor (NMOS) devices. Advantageously, implementations of the present disclosure remove the otherwise-needed NW-to-NW spacing between the various library cells by tying the NW terminal (that is, the "body" terminal of the PMOS devices) of each of the library cells to a global supply voltage that is always available (i.e., "always on"). The removal of the NW-to-NW spacing between the abutted library cells greatly reduces silicon area of the MV CMOS IC.

In one aspect, a MV CMOS IC may include a plurality of first CMOS cells, a plurality of first CMOS cells, one or more N-wells and one or more always-on taps (ATAPs). Each of the first CMOS cells may have a supply terminal that is configured to receive a local supply voltage. Each of the first CMOS cells may also have an N-well (NW) terminal that is configured to receive a global supply voltage. The global supply voltage may be different than the local supply voltage. The second CMOS cells may include always-on (AON) cells. Each of the second CMOS cells may have a supply terminal that is configured to receive the global supply voltage. Each of the second CMOS cells may also have an NW terminal that is configured to receive the global supply voltage. The NW terminal of at least one of the second CMOS cells and the NW terminal of at least one of the first CMOS cells may be formed in a first N-well of the one or more N-wells. The first N-well is configured to receive the global supply voltage through the one or more ATAPs disposed in the first N-well.

In another aspect, a method for disposing ATAPs for a MV CMOS IC may involve determining a maximum allowable tap spacing value (X) dictated by a semiconductor technology used to fabricate the MV CMOS IC. The method may also involve determining a metal pitch value (Y) of a plurality of metal stripes of a global power grid according to a physical design of the MV CMOS IC. The method may further involve determining whether X is not smaller than Y. In response to a determination that X is not smaller than Y, the method may involve disposing the ATAPs along and directly under the plurality of metal stripes with a spacing between adjacent ATAPs not larger than X, with other design rules required by the semiconductor technology fulfilled.

BRIEF DESCRIPTION OF THE DRAWINGS

The accompanying drawings are included to provide a further understanding of the disclosure, and are incorporated in and constitute a part of the present disclosure. The drawings illustrate implementations of the disclosure and, together with the description, serve to explain the principles of the disclosure. It is appreciable that the drawings are not necessarily in scale as some components may be shown to be out of proportion than the size in actual implementation in order to clearly illustrate the concept of the present disclosure.

DETAILED DESCRIPTION OF PREFERRED IMPLEMENTATIONS

Overview

Figure 1:
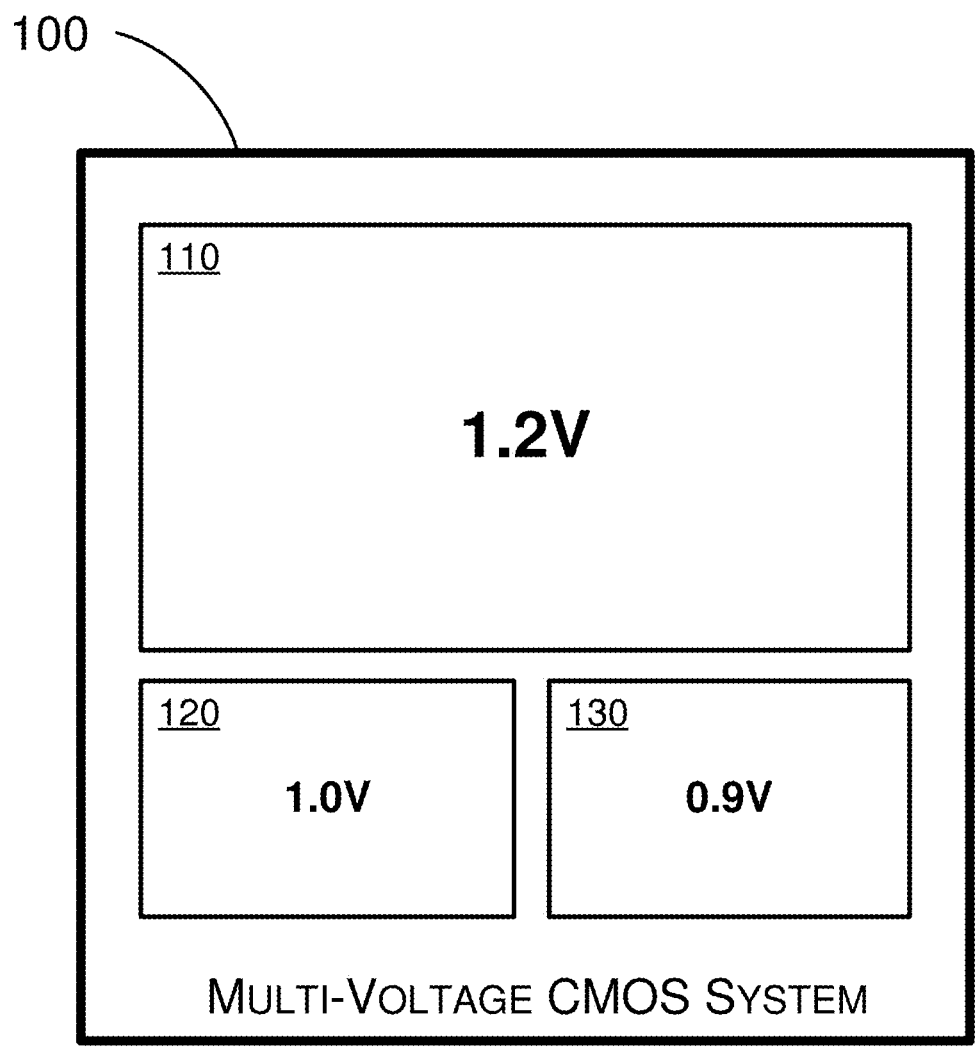
FIG. 1 is an illustration of a power management scheme employed by a MV CMOS IC during normal operation in accordance with an implementation of the present disclosure.

FIG. 1 is an illustration of a power management scheme employed by a MV CMOS IC 100 during normal operation in accordance with an implementation of the present disclosure. MV CMOS IC 100 includes domain 110 that operates from a first supply voltage, a domains 120 that operates from a second supply voltage and a domain 130 that operates from a third supply voltage. One or more of domains 110, 120 and 130 may be configured to be powered down during PPD. Solely for illustrative purpose without limiting the scope of the present disclosure, first supply voltage is shown to be 1.2V, second supply voltage is shown to be 1.0V and third supply voltage is shown to be 0.9V in the example illustrated in FIG. 1. In various implementations in accordance with the present disclosure, each of first, second and third supply voltages may have other values depending on the actual implementation.

When a domain of MV CMOS IC 100 is powered down during PPD, a power supply from which the domain operates is disabled from supplying electrical currents to that domain. This may be implemented by pulling the power supply to electrical ground, by setting the power supply to a "high impedance" state, or by other measures commonly known in the art. However, not all CMOS devices in the PD domain are powered down and consume essentially zero power from the power supply. Rather, some devices in the PD domain (i.e., the AON cells) will need to continue operating, or remain "on", during PPD. The AON cells are kept "on" during PPD for purposes such as buffering feed-through nets that cross the PD domain, buffering high fan-out nets, and buffering nets controlled by retention registers.

Figure 2:
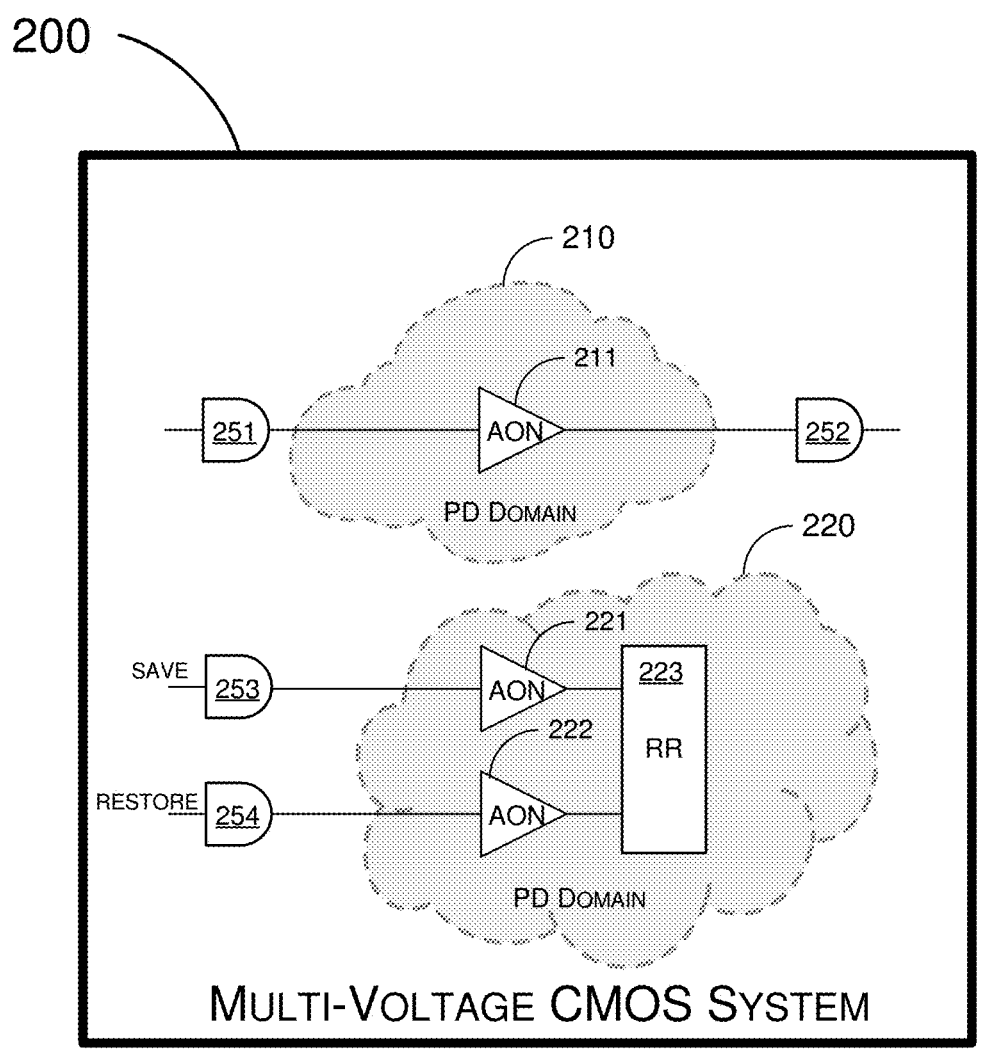
FIG. 2 is an illustration of always-on cells within PD domains of a MV CMOS IC during PPD in accordance with an implementation of the present disclosure.

Two such PD domains are illustrated in MV CMOS IC 200 shown in FIG. 2. For example, PD domain 210 includes an AON buffer 211. While the rest of the CMOS devices of PD domain 210 are powered down and thus substantially consume no current during PPD, AON buffer 211 is still functioning normally to buffer a feed-through signal from gate 251 to gate 252, each located outside PD domain 210. As another example, PD domain 220 includes AON buffers 221 and 222, and a retention register (RR) 223. While the rest of the CMOS devices of PD domain 220 are powered down and thus substantially consume no current during PPD, AON buffers 221 and 222 and RR 223 are still functioning normally to buffer and retain control signals received from gates 253 and 254 that are located outside PD domain 220.

Apparently, the AON cells, such as RR 223 and AON buffers 211, 221 and 222 shown in FIG. 2, cannot operate from the same power supply used by the rest of the devices in the PD domain during normal operation, for the normally available power supply has been disabled to the PD domain during PPD as described previously. Rather, the AON cells will need to operate from a different power supply, one that remains available during PPD. This different power supply from which the AON cells operate may have a voltage level that is different from the voltage level of the other power supply that is disabled to the PD domain during PPD. Typically, the always-on power supply has a voltage level higher than that of the other power supply.

The present disclosure aims at eliminating the need of the area-taking NW-to-NW spacing in a MV CMOS IC, such as MV CMOS IC 100 shown in FIG. 1, by biasing the NW terminal of each of the CMOS cells, including AON cells and regular cells, using a same voltage. Specifically, for the regular CMOS cells that are to be powered down during PPD, the present disclosure replaces the conventional PMOS "local-tie" configuration with a new configuration that decouples the NW biasing with the power supply of the regular CMOS cells.

Figure 3:
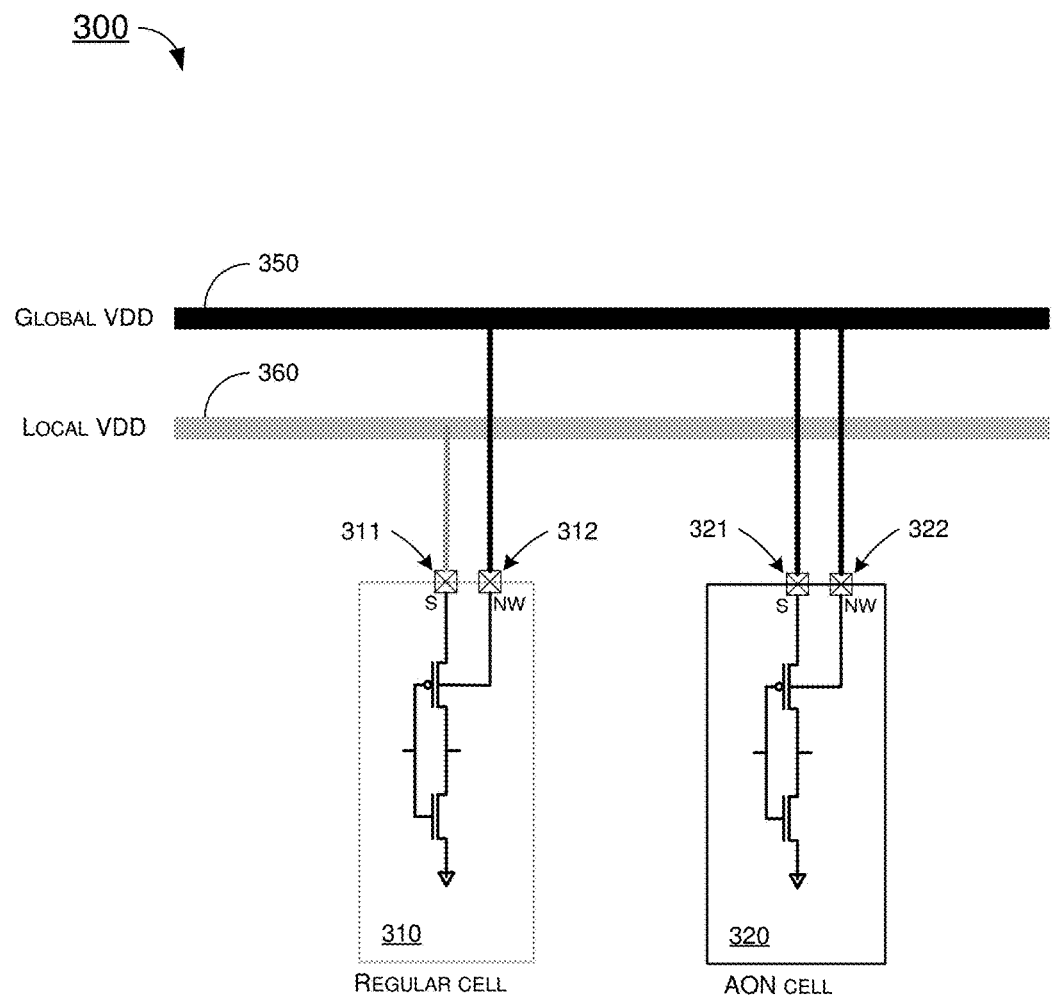
FIG. 3 is a schematic diagram of a portion of a PD domain of a MV CMOS IC in accordance with an implementation of the present disclosure.

As shown in FIG. 3, an example MV CMOS IC 300 includes a regular cell 310 that is to be powered down during PPD, and an AON cell 320 that remains in an operational state during PPD. AON cell 320 has both its supply terminal 321 and NW terminal 322 configured to receive a global supply voltage, global VDD 350, that stays available during the entire period of operation of MV CMOS IC 300. Regular cell 310, while having its supply terminal 311 connected to a local supply voltage, local VDD 360, that is unavailable during PPD, has its NW terminal 312 connected to global VDD 350. Namely, supply terminal 311 and NW terminal 312 of regular cell 310 are no longer "locally tied" together, but each is configured to receive a different voltage. This new configuration enables the N-well of regular cell 310 to be biased at the same voltage level as the N-well of AON cell 320, with both biased at the voltage level of global VDD 350. As the N-well of regular cell 310 and the N-well of AON cell 320 are biased at the same voltage level, the two NWs are allowed by the design rule to abut against each other, or, equivalently, merge into a single continuous NW. Consequently and advantageously, the requirement of NW-to-NW spacing due to the conventional "local-tie" configuration is removed, thereby saving much silicon area.

Figure 4:
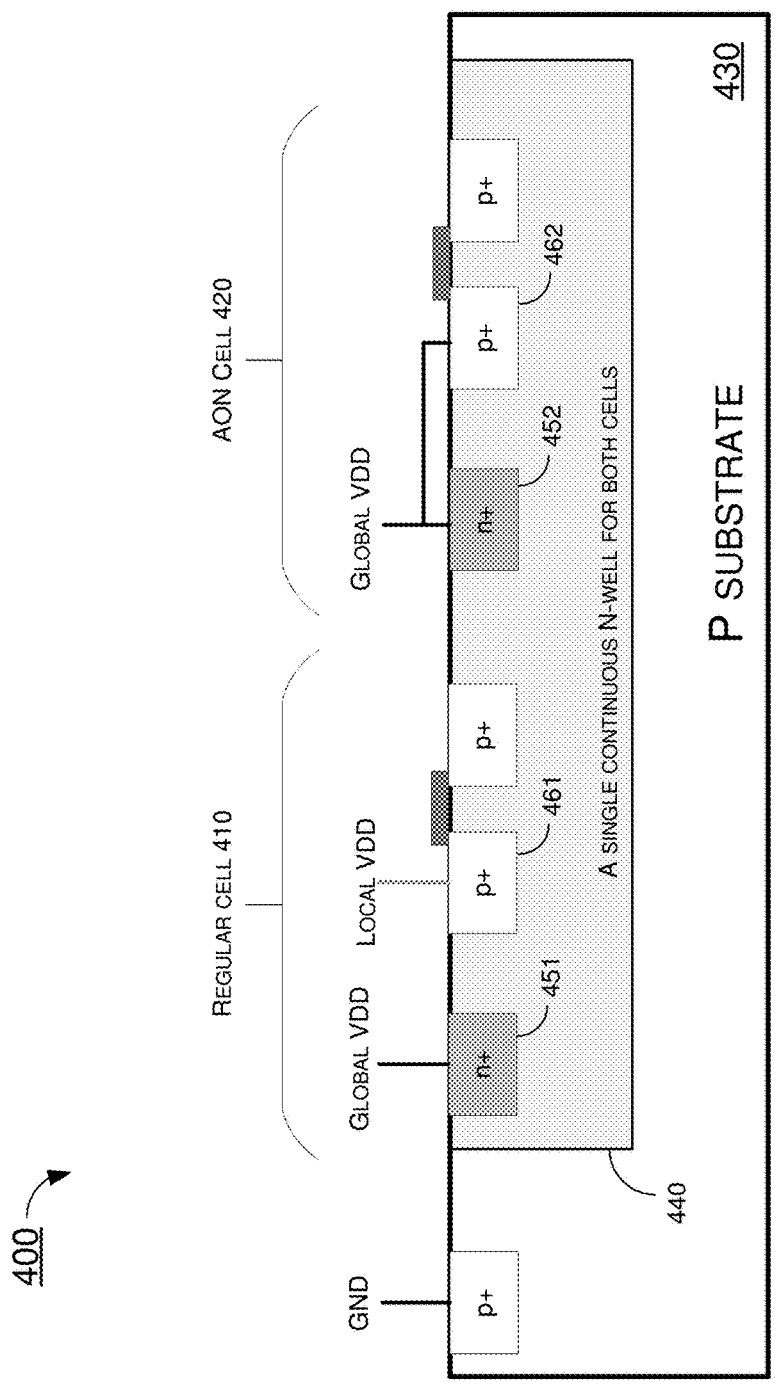
FIG. 4 is an illustration of a physical realization PMOS devices of the portion of the PD domains of the MV CMOS IC of FIG. 3 in accordance with an implementation of the present disclosure.

FIG. 4 illustrates a physical realization 400 of the new configuration of FIG. 3 according to the present disclosure. A regular cell 410 corresponding to regular cell 310 and an AON cell 420 corresponding to AON cell 320 are realized on a same semiconductor substrate 430. Instead of each having a respective NW with a NW-to-NW spacing between the two separate NWs, regular cell 410 and AON cell 420 are disposed in a single continuous N-well 440 that serves as a common NW terminal for both regular cell 410 and AON cell 420. N-well 440 is biased to global VDD through ATAPs 451 and 452. Regular cell 410 has its supply terminal 461 electrically coupled to local VDD, and thus operates from local VDD during normal operation periods and is powered down during PPD. On the other hand, AON cell 420 has its supply terminal 462 electrically coupled to global VDD, and thus operates from global VDD for both normal operation periods and PPD periods. In some embodiments, global VDD may be higher than local VDD in voltage level, and thus a p-n junction between supply terminal 461 and N-well 440 is reversely biased even for normal operation.

Figure 5:
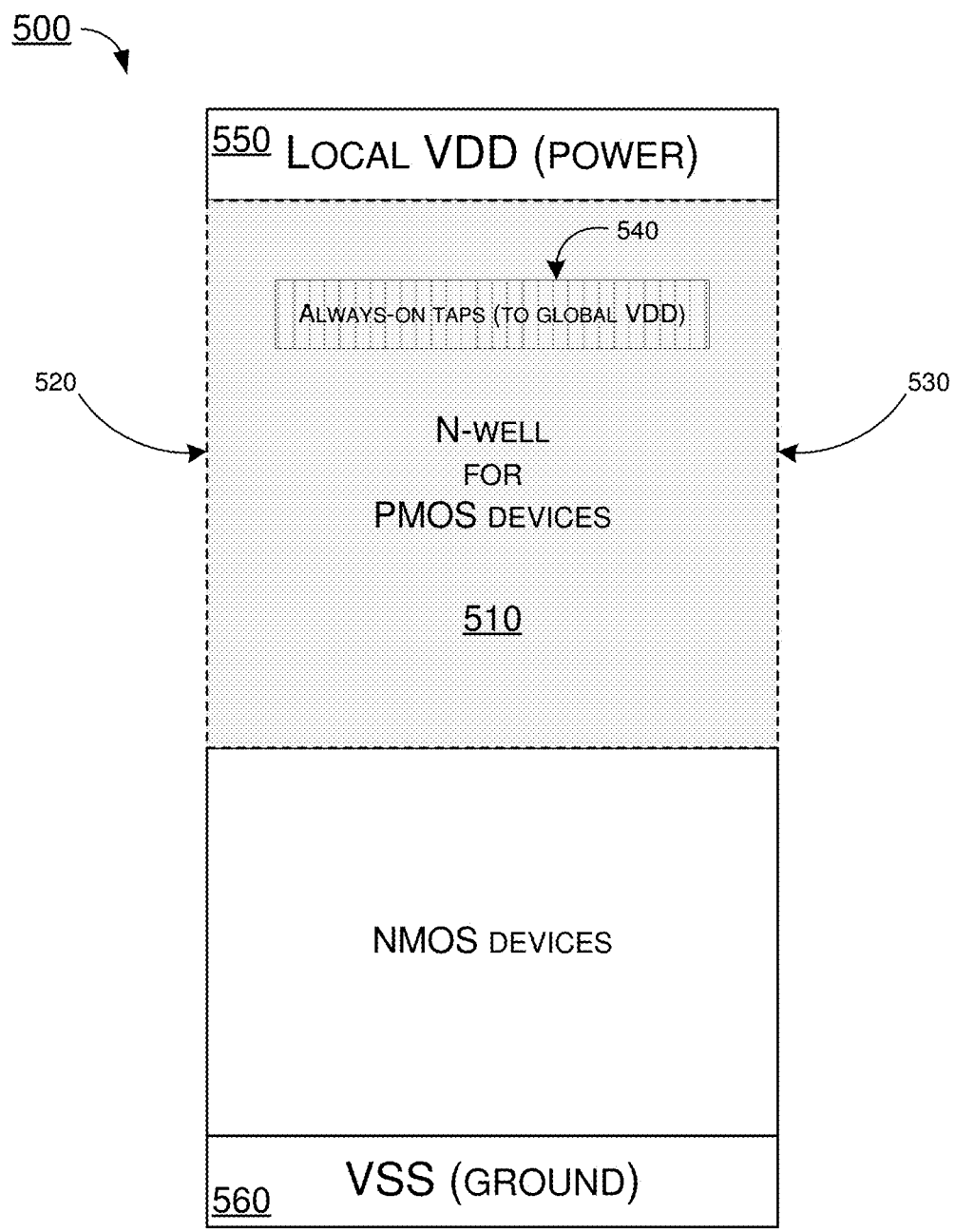
FIG. 5 is an illustration of a 2D layout of an AON cell in accordance with an implementation of the present disclosure.
Figure 6:
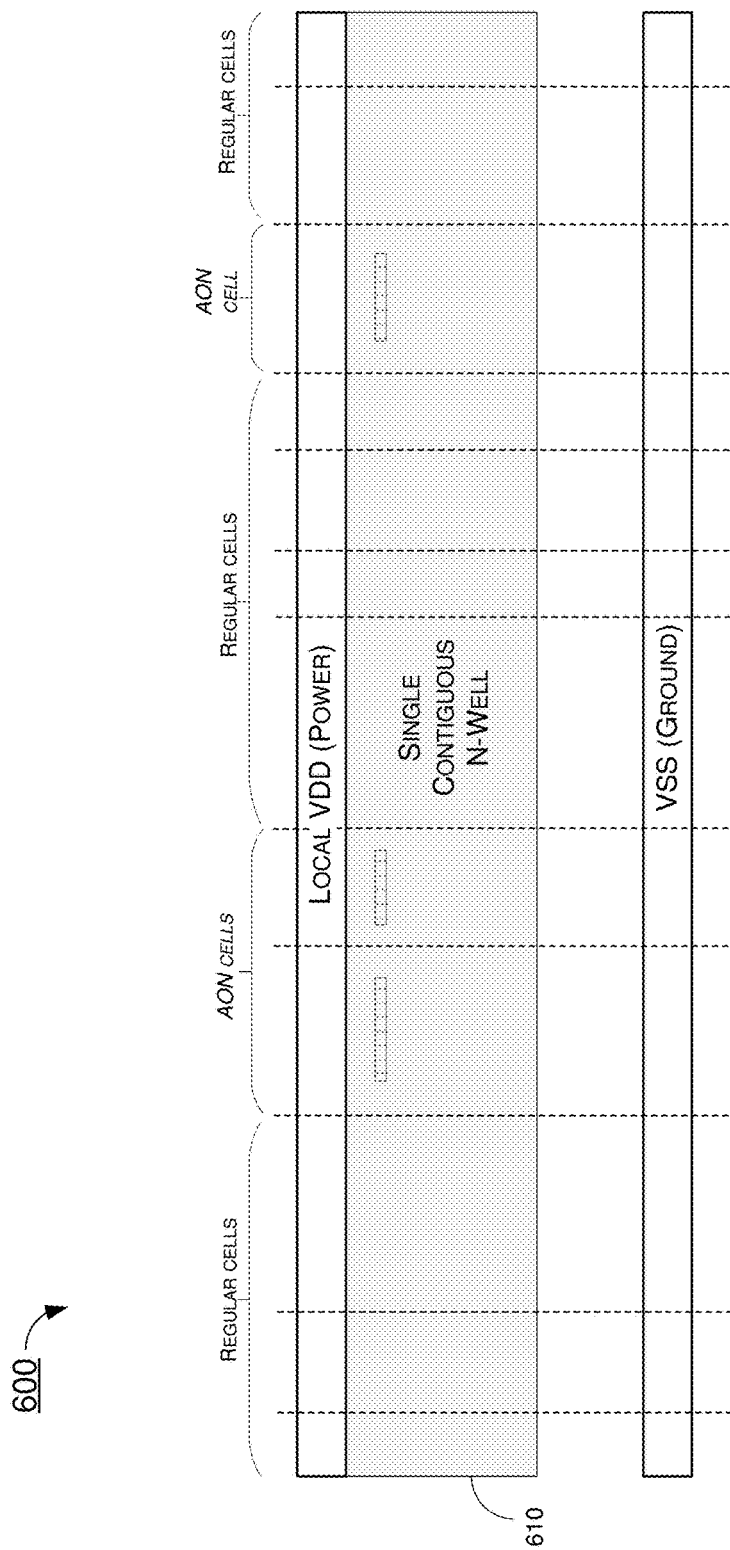
FIG. 6 is an illustration of a 2D layout of a PD domain encompassing regular cells and AON cells in accordance with an implementation of the present disclosure.
Figure 14:
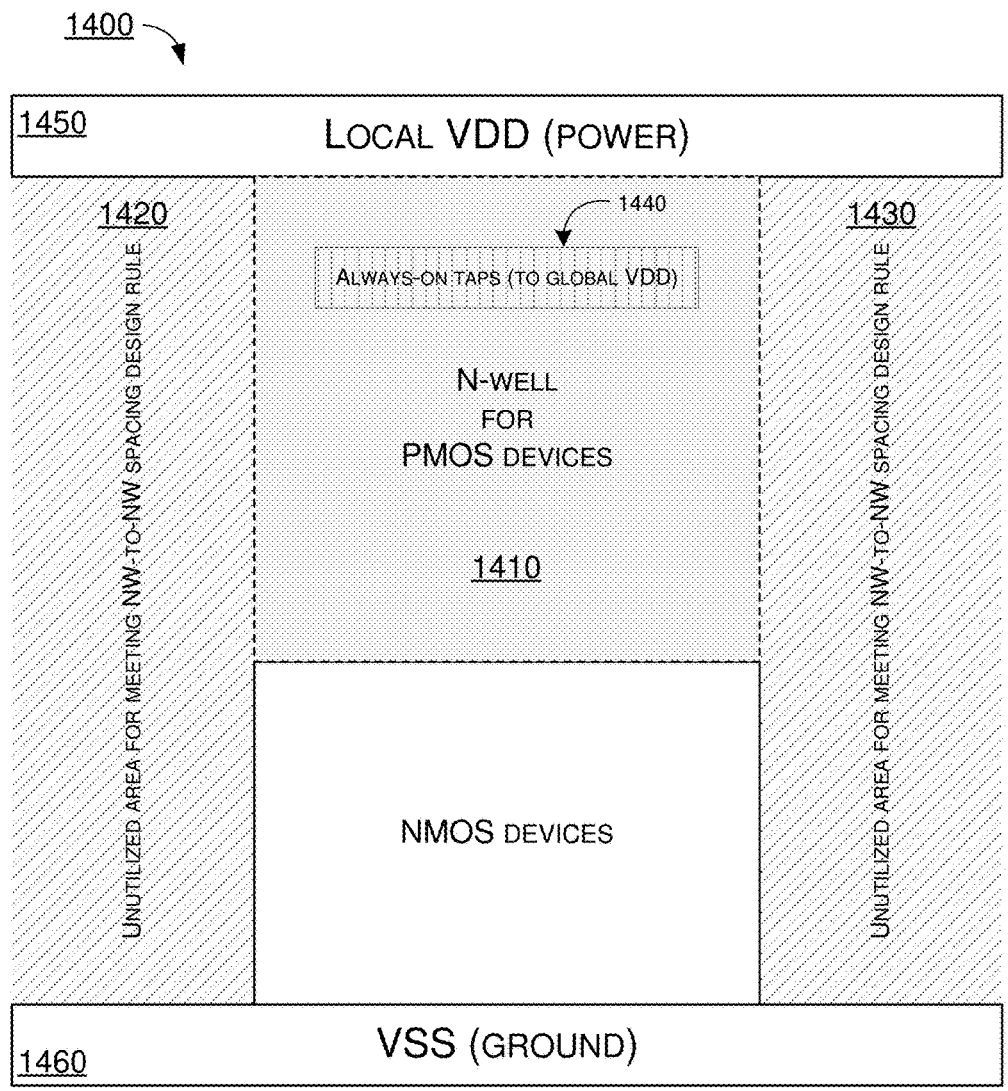
FIG. 14 is an illustration of a 2D layout of an AON cell implemented in a conventional way.
Figure 15:
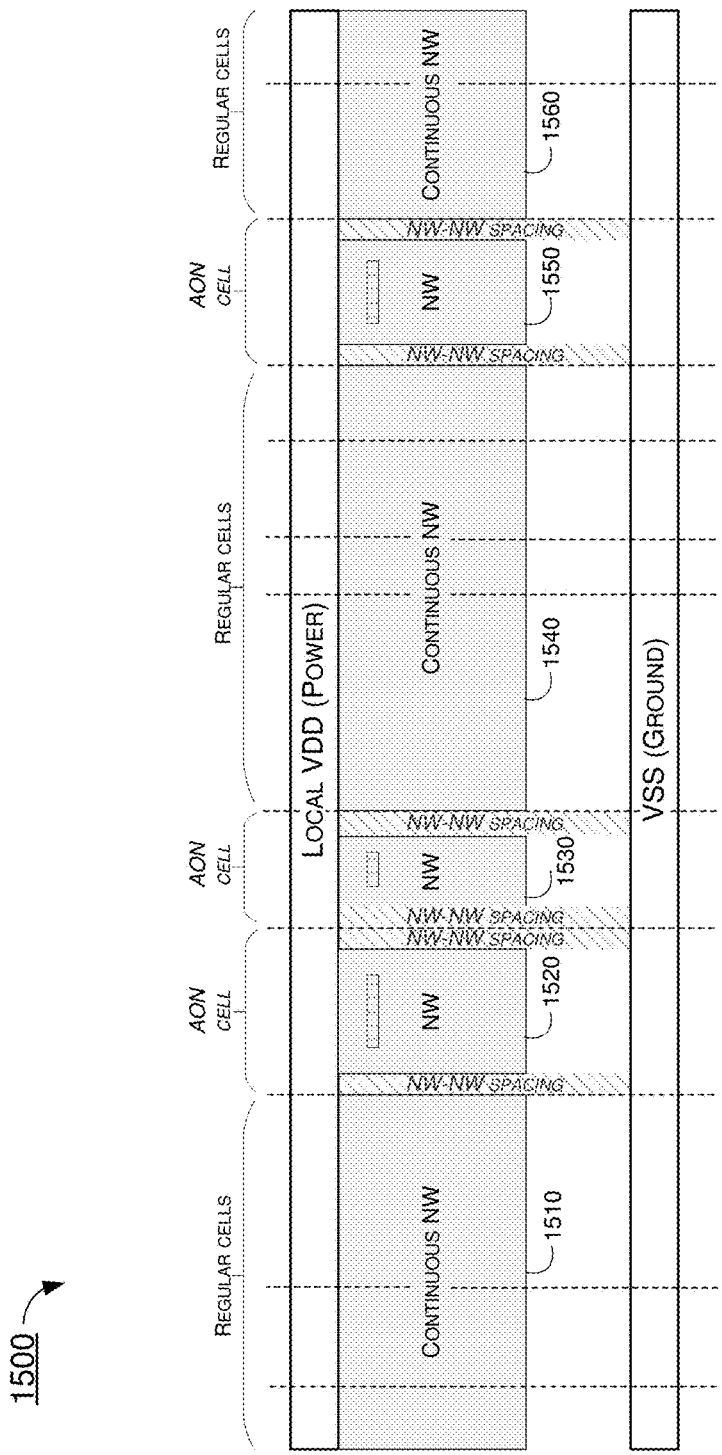
FIG. 15 is an illustration of a 2D layout of a PD domain encompassing regular cells and AON cells implemented in a conventional way.

FIG. 5 is an illustration of a 2D layout 500 of an AON cell in accordance with an implementation of the present disclosure. As compared to the 2D layout of the conventional AON cell of FIG. 14, the 2D layout 500 of FIG. 5 provides the benefit of significant saving in area, thanks to the elimination of NW-to-NW spacing on the lateral abutting sides of the layout. The present disclosure enables 2D layout 500 of the AON cell to have its NW 510 fully extending to the left and right abutting sides 520 and 530 of 2D layout 500. No silicon area would be wasted as NW-to-NW spacing when one or more instances of 2D layout 500 abut against one another or one or more regular cells to form a 2D layout 600 of a MV CMOS IC, as shown in FIG. 6. Each of the CMOS cells in the 2D layout 600, regardless if it is an AON cell or a regular cell, abuts against other CMOS cells on the lateral sides of respective layout, thereby forming a single continuous N-well region 610 that is fully utilized without wasting substrate area on NW-to-NW spacing. Similar to FIG. 14, an ATAP 540 is used to bias NW 510 at global VDD level. Local VDD metal stripe 550 and ground (VSS) metal strip 560 are also included in 2D layout 500 of the AON cell so as to facilitate abutment against adjacent CMOS cells, even though local VDD metal stripe 550 is not electrically part of AON cell 320 and 420.

Figure 7:
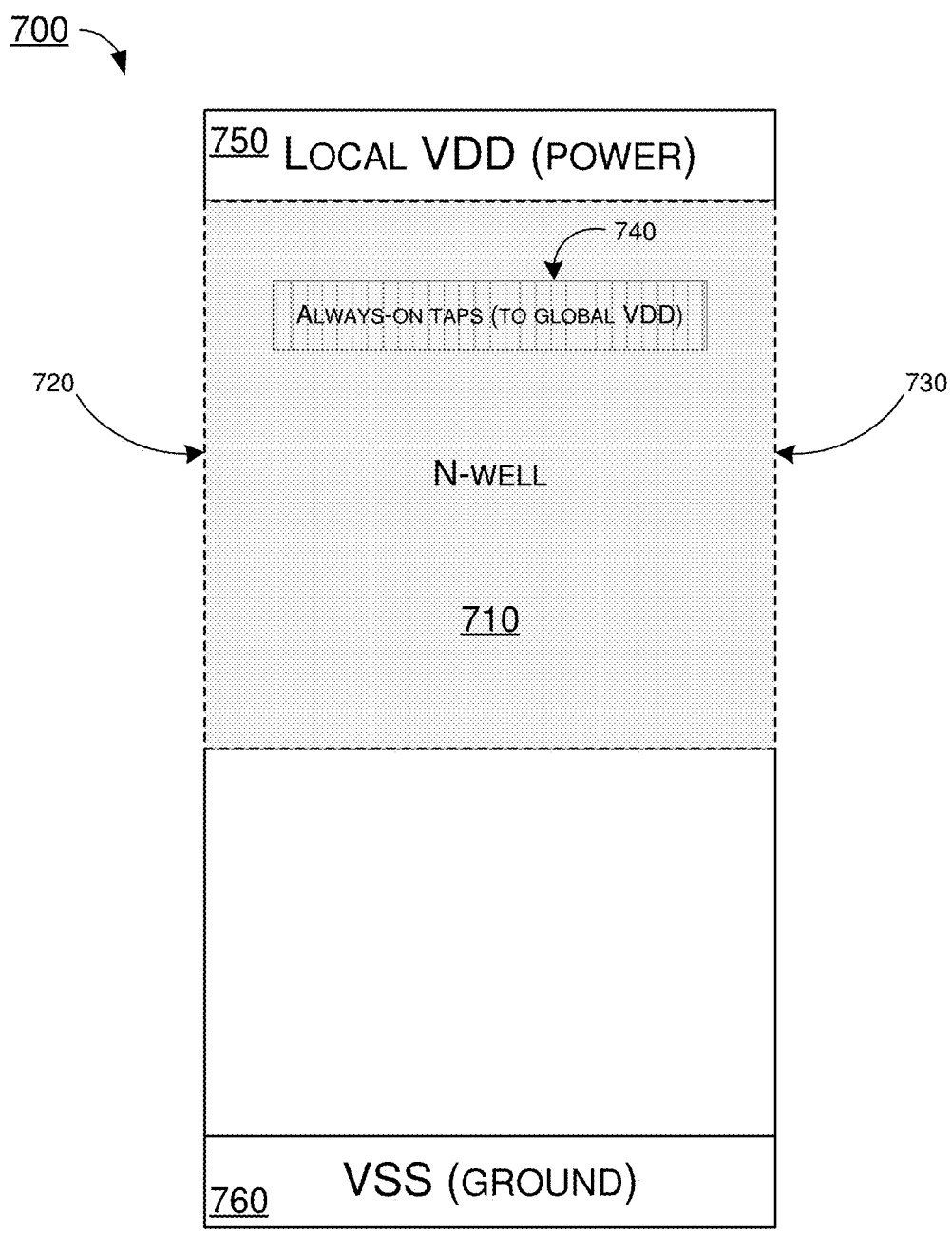
FIG. 7 is an illustration of a 2D layout an always-on tap (ATAP) in accordance with an implementation of the present disclosure.

While ATAP 452 of AON cell 420 may have been included in layout 500 as ATAP 540, one or more ATAPs, such as ATAP 451 of regular cell 410, may have to be added, or inserted, to 2D layout 600 at various locations to ensure proper bias of single continuous NW 610. ATAP 451 may have a 2D layout 700 as illustrated in FIG. 7. The 2D layout 700 of the ATAP includes ATAP 740 that is disposed in NW 710 and configured to bias NW 710 at the global supply voltage level (global VDD). Local VDD metal stripe 750 and ground (VSS) metal strip 760 are also included in 2D layout 700 of the ATAP so as to facilitate abutment against adjacent CMOS cells, even though local VDD metal stripe 740 is not electrically part of the ATAP. The abutment of various cells are typically executed by an automated place-and-route (PNR) process to realize the electrical connections among various devices of the MV CMOS IC as designed.

A dimension of each part of 2D layout 700 of the ATAP is substantially same as a dimension of a corresponding part of an adjacent CMOS cell abutting against the ATAP. This is required to facilitate the abutment between ATAP and adjacent CMOS cells. For example, NW 710 of FIG. 7 has a dimension on the lateral sides of 720 and 730 of 2D layout 700 that is the same as a dimension of NW 510 of FIG. 5 on the lateral sides of 520 and 530 of 2D layout 500. Similarly, a dimension of each of local VDD metal strip 750 and VSS metal strip 760 on the lateral sides of 720 and 730 is the same as a dimension of respective local VDD metal strip 550 and VSS metal strip 560 on the lateral sides of 520 and 530. Furthermore, a distance between NW 710 and VSS metal strip 760 is same as a distance between NW 510 and VSS metal strip 560, where the NMOS devices are located.

Figure 8:
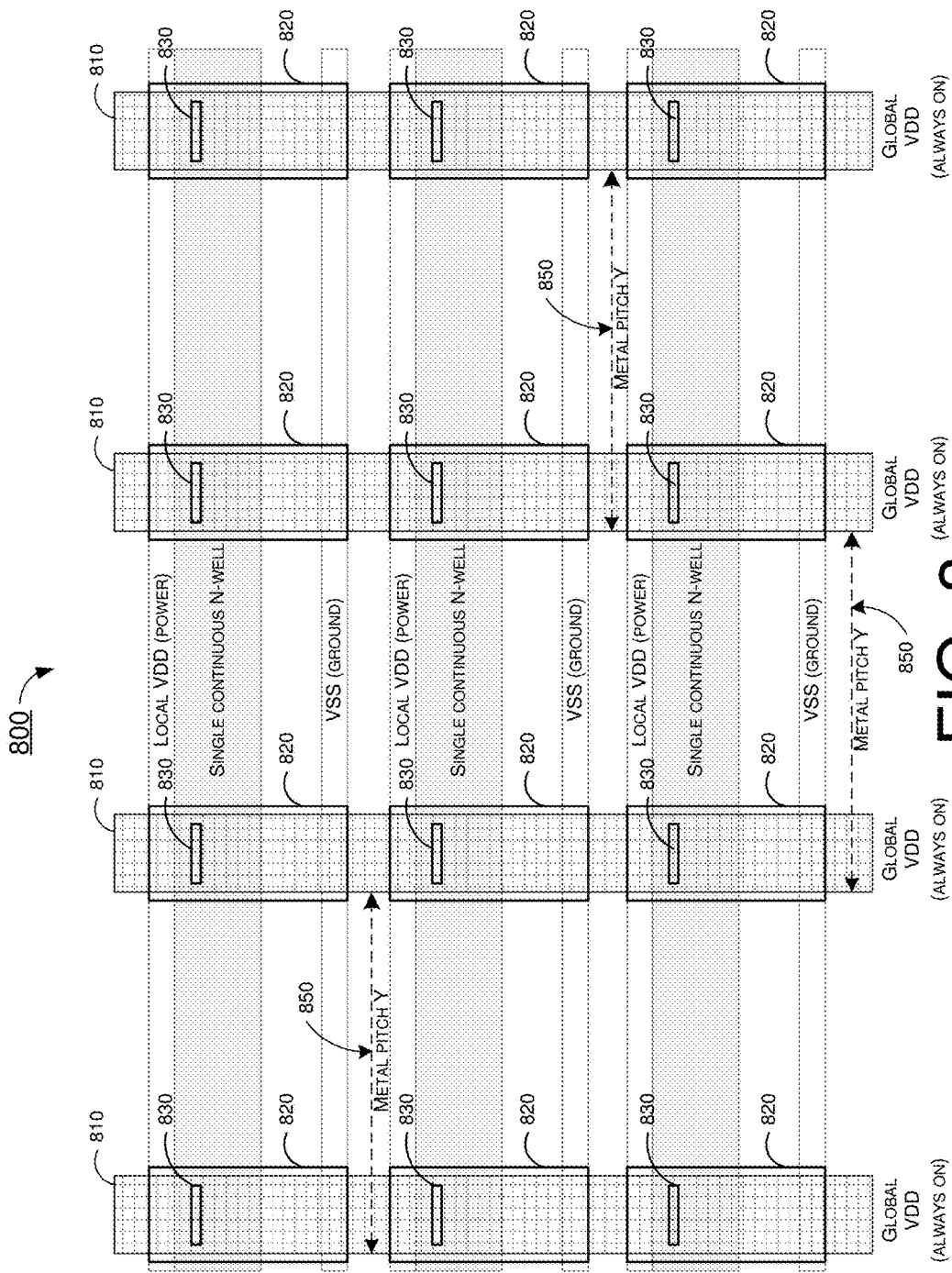
FIG. 8 is an illustration of an ATAP insertion scheme in accordance with an implementation of the present disclosure.

FIG. 8 illustrate an example scheme 800 for inserting ATAPs in a 2D layout of a MV CMOS IC. After various CMOS cells, regular and AON cells alike, are abutted together by PNR to form one or more continuous NWs as shown in FIG. 8, ATAPs are to be added, or inserted, to the 2D layout. The 2D layout includes a power grid composed of metal stripes 810 that carry the always-on global supply voltage (global VDD). The metal stipes are separated from each other by a metal pitch 850 in distance. The value of metal pitch 850, which is also labeled as "Y" in FIG. 8, is typically determined by a center-to-center distance between two adjacent metal stripes 810. When the two adjacent metal stripes 810 have the same metal width, as in the case shown in FIG. 8, the value of Y can also be determined equivalently by an edge-to-edge distance between the two adjacent metal stripes 810, as shown in FIG. 8. The ATAPs 820 are inserted directly underneath metal stripes 810 of the global power grid. Each of the ATAPs 820 is electrically coupled to the global power grid by one or more stacked power vias 830 disposed between the ATAP 820 and the respective metal strip 810 located directly above the ATAP 820. The stacked vias 830 are employed to achieve better routing efficiency and/or reduce overall die size.

For most semiconductor processing technologies, a design rule called "latch-up rule" is usually in place to dictate a maximum allowable distance (X) between any two adjacent NW taps. That is, when the distance between two adjacent NW taps is larger than X, latch-up may happen to CMOS devices in those NWs, causing unexpected and undesired circuit behavior. Apparently, for ATAP insertion scheme 800 to pass the latch-up rule, it is required that metal pitch 850, or equivalently, Y, has to be no larger than X.

Figure 9:
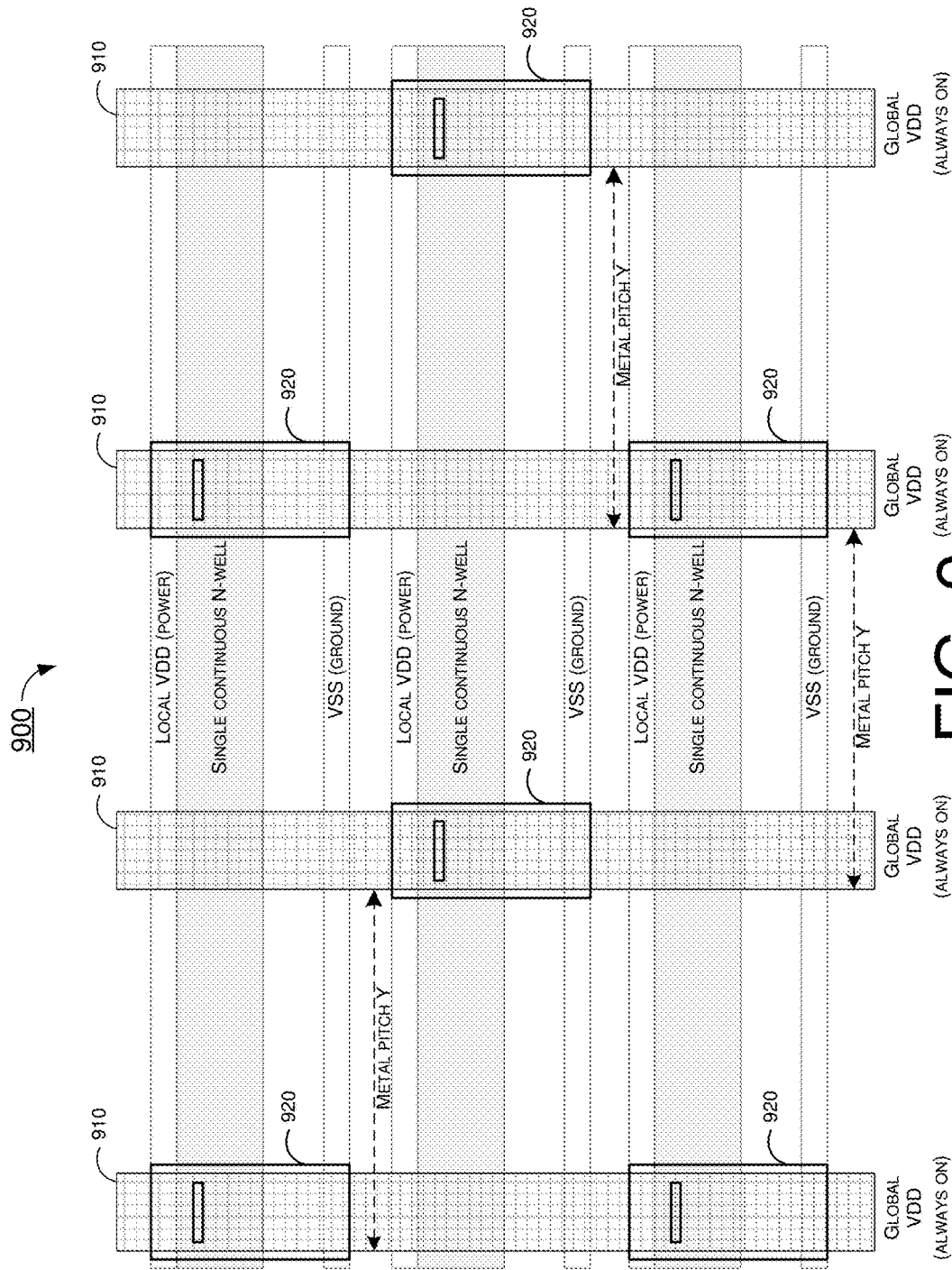
FIG. 9 is an illustration of an ATAP insertion scheme in accordance with another implementation of the present disclosure.

ATAP insertion scheme 800 is an example of so-called "linear fashion" of tap insertion, which means the ATAPs are aligned with respect to the metal stripes 810 of the global power grid and the number of ATAPs on each metal stripe 810 is the same. Without violating the latch-up rule, another type of tap insertion scheme, called "staggered fashion", may be adopted to reduce the total number of taps needed. FIG. 9 illustrate an example staggered fashion ATAP insertion scheme 900. Same as ATAP insertion scheme 800, ATAP insertion scheme 900 also has all the ATAPs 910 located underneath and thus aligned with respect to the metal stripes 910 that form a global power grid. The difference resides in that staggered-fashion ATAP insertion scheme 900 uses only half of the number of ATAPs as compared to linear-fashion ATAP insertion scheme 800, and also in that the ATAPs in FIG. 9 are staggered instead of linear with respect to the global power grid.

Figure 10:
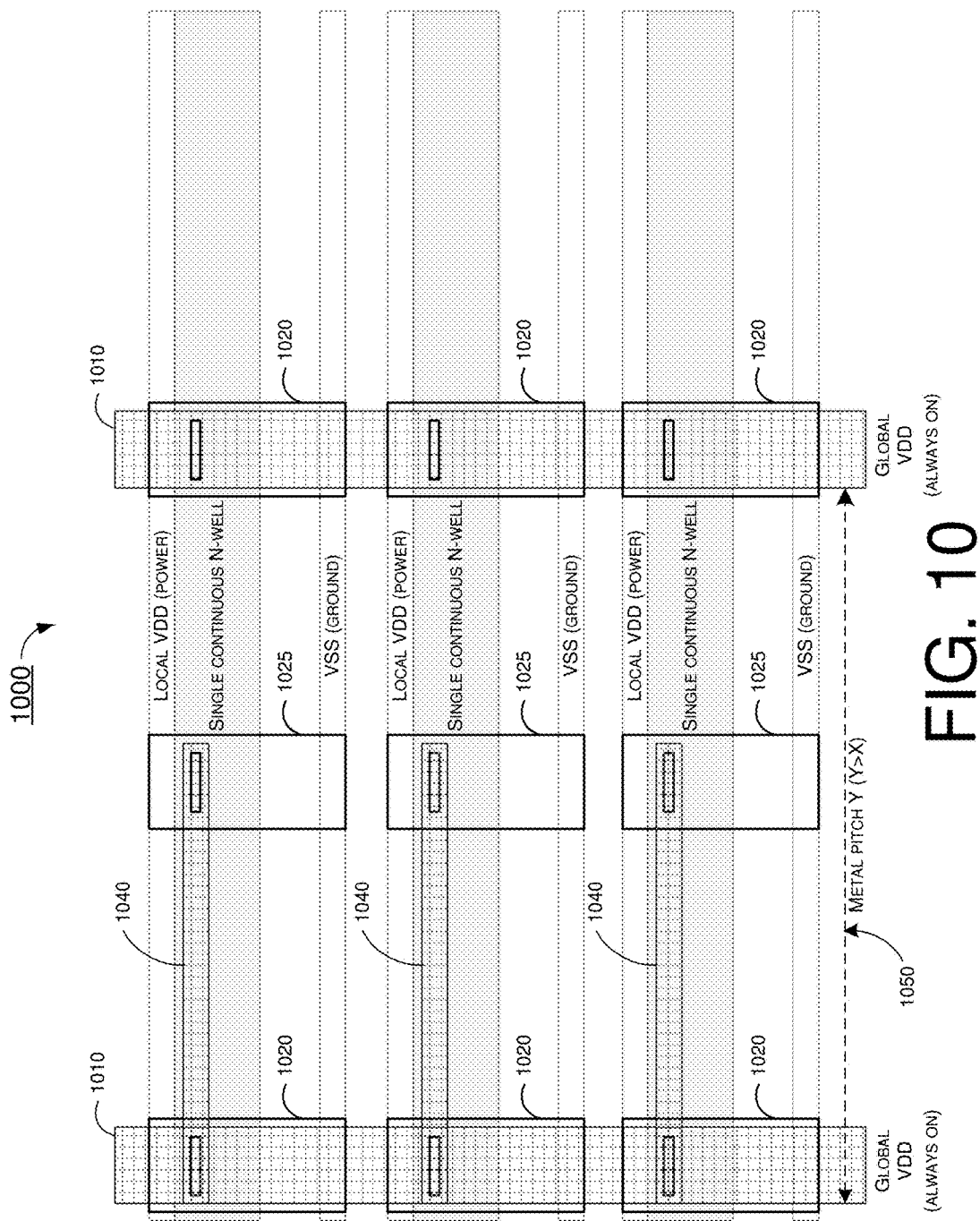
FIG. 10 is an illustration of an ATAP insertion scheme in accordance with yet another implementation of the present disclosure.

Ideally, ATAPs are to be disposed directly underneath the metal stripes of the global power grid such that stacked vias can be employed to connect the ATAPs to the global power grid in-situ, as shown in FIGS. 8 and 9. However, for some situations, an ATAP may not have the option of being disposed directly underneath a metal stripe of the global power grid, and a metal segment is thus needed to connect the global power supply to the ATAP. FIG. 10 illustrate such an example ATAP insertion scheme 1000. For the MV CMOS IC layout shown in FIG. 10, metal pitch Y 1050 is larger than the maximum allowable distance X between adjacent NW taps, as dictated by the latch-up design rule. Therefore, it is not enough to insert only ATAPs 1020 that are located directly underneath metal stripes 1010 of the global power grid. More ATAPs, such as ATAPs 1025, will also need to be inserted so as to comply with the latch-up rule. ATAPs 1025 will thus not align with metal stripes 1010, and will need to be connected to at least one metal stripe 1010 by metal segments 1040.

Figure 11:
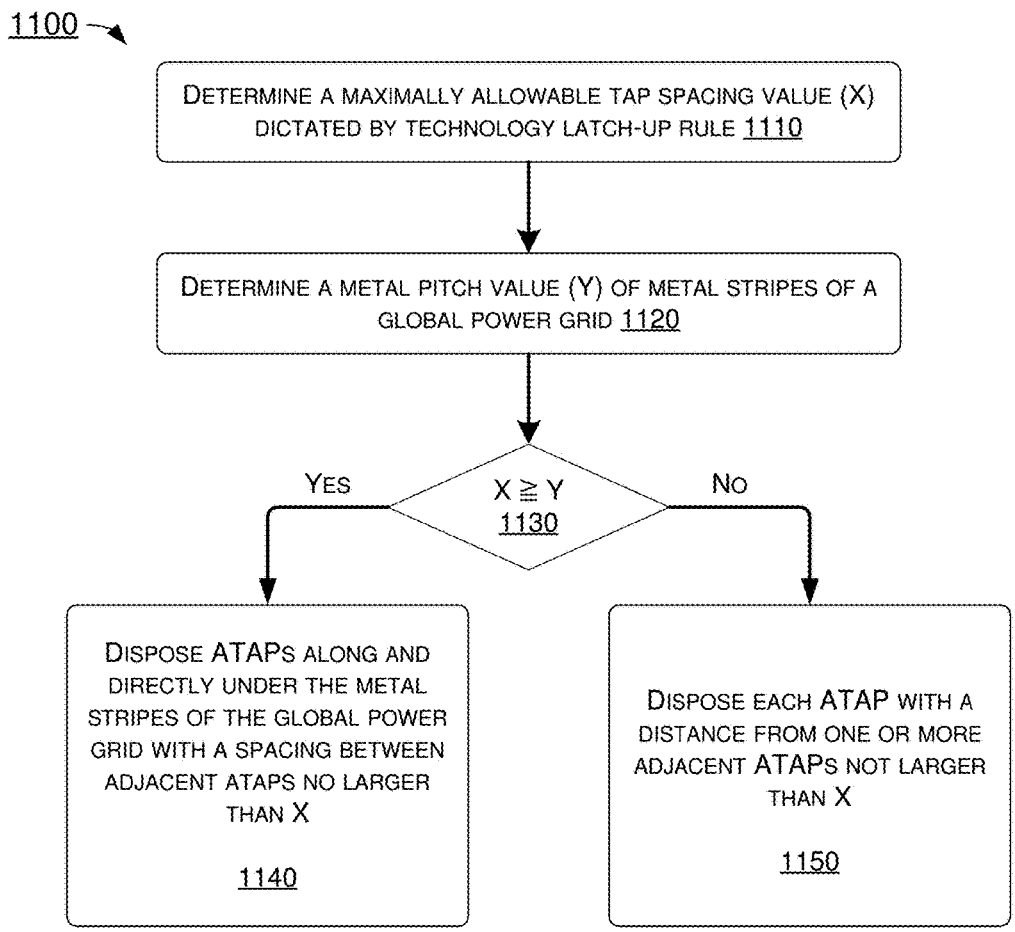
FIG. 11 is a flowchart of an example process for disposing ATAPs in accordance with an implementation of the present disclosure.
Figure 12:
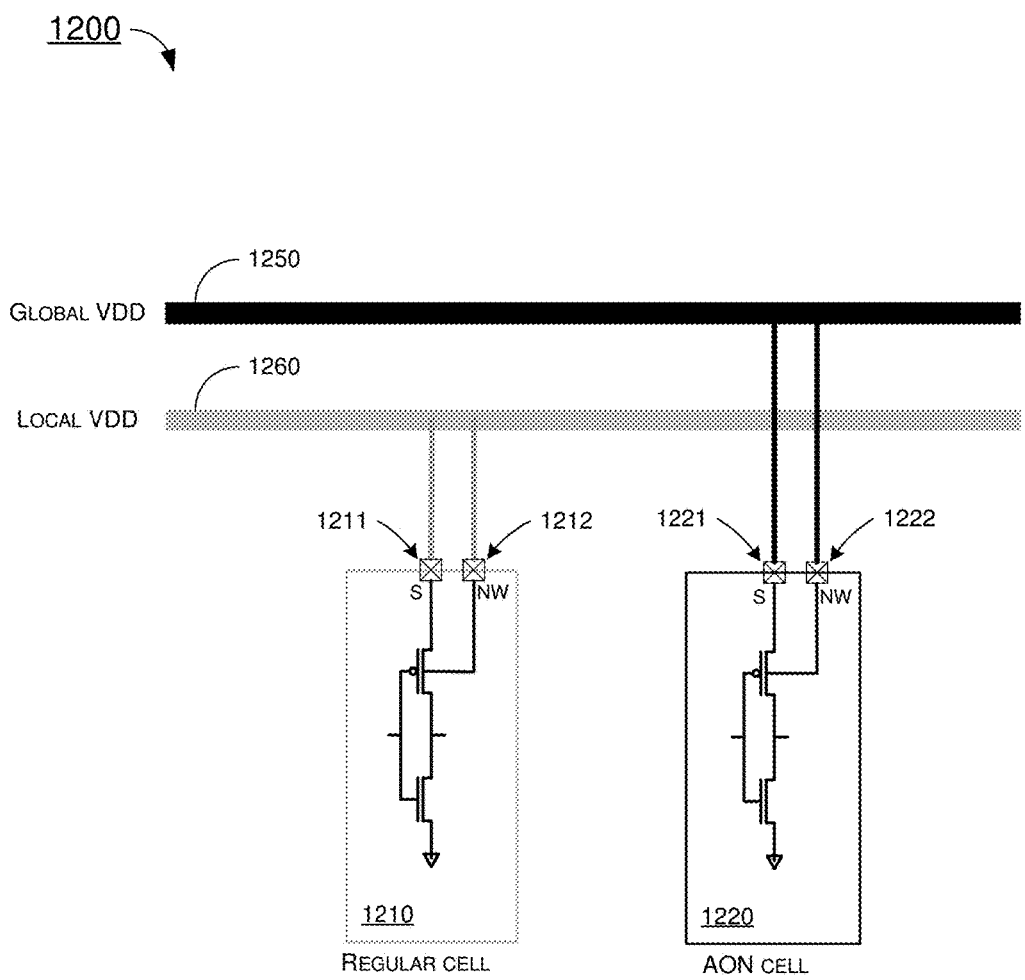
FIG. 12 is a schematic diagram of a portion of a PD domain of a MV CMOS IC implemented in a conventional way.
Figure 13:
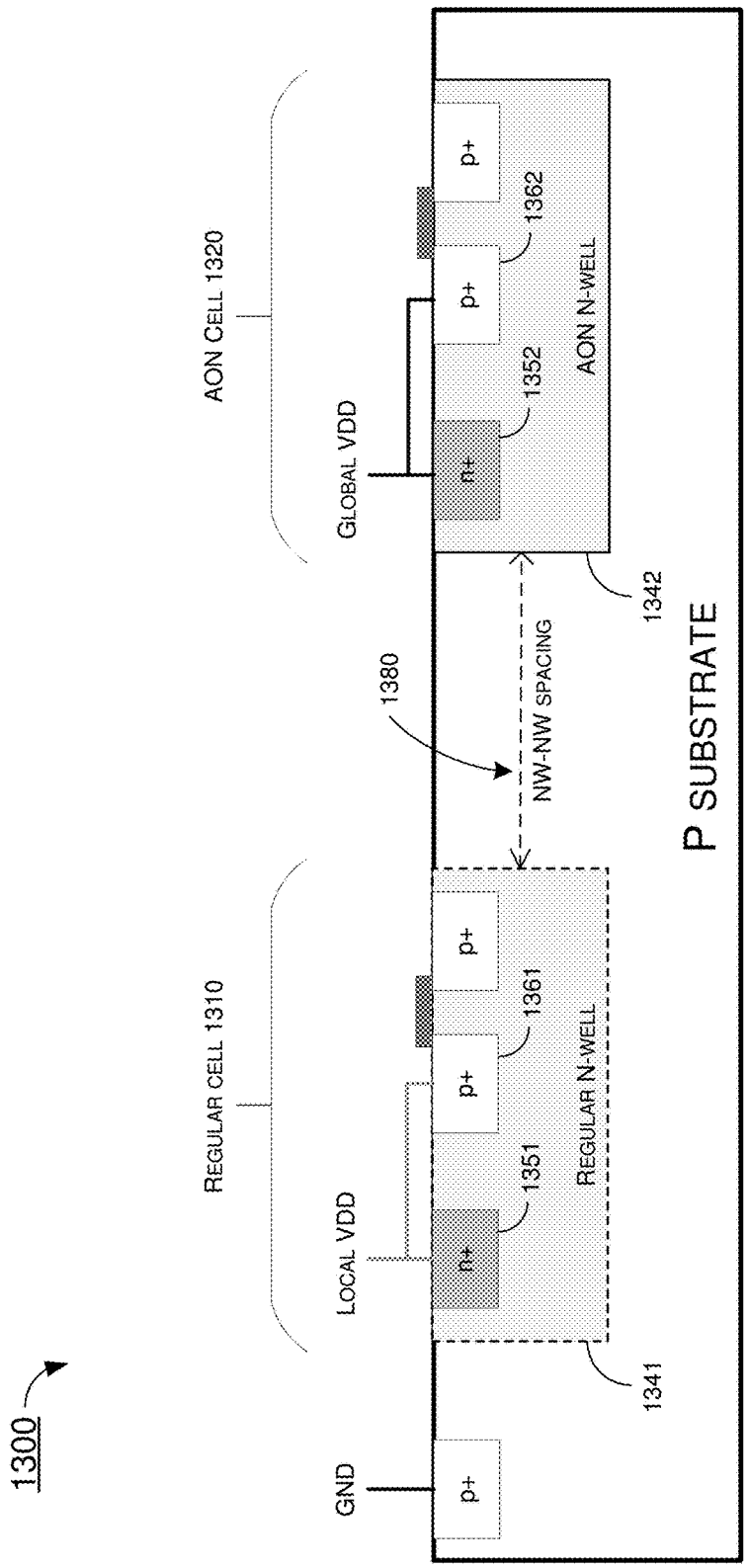
FIG. 13 is an illustration of a physical realization of PMOS devices of the portion of the PD domains of the MV CMOS IC of FIG. 13, implemented in a conventional way.

FIG. 11 illustrates an example process 1100 for disposing ATAPs for a MV CMOS IC in accordance with an implementation of the present disclosure. Process 1100 may include one or more operations, actions, or functions as illustrated by one or more of blocks 1110, 1120, 1130, 1140 and 1150. Although illustrated as discrete blocks, various blocks of process 1100 may be divided into additional blocks, combined into fewer blocks, or eliminated, depending on the desired implementation. Process 1100 may begin at block 1110.

At block 1110, process 1500 may involve determining a maximum allowable tap spacing value (X) dictated by a semiconductor technology used to fabricate the MV CMOS IC. Process 1100 may proceed from block 1110 to block 1120.

At block 1120, process 1100 may involve determining a metal pitch value (Y) of a plurality of metal stripes of a global power grid according to a physical design of the MV CMOS IC. Process 1100 may proceed from block 1120 to block 1130.

At block 1130, process 1100 may involve determining whether X is not smaller than Y. Process 1100 may proceed from block 1130 to block 1140 in response to a determination that X is not smaller than Y. Alternatively, process 1100 may proceed from block 1130 to block 1150 in response to a determination that X is smaller than Y.

At block 1140, process 1100 may involve disposing the ATAPs along and directly under the plurality of metal stripes with a spacing between adjacent ATAPs not larger than X and with other design rules required by the semiconductor technology fulfilled.

At block 1150, process 1100 may involve disposing each of the ATAPs with a distance from one or more adjacent ATAPs not larger than X and with other design rules required by the semiconductor technology fulfilled.

In some implementations, process 1100 may involve disposing the ATAPs in a linear fashion with respect to the global power grid.

In some implementations, process 1100 may involve disposing the ATAPs in a staggered fashion with respect to the global power grid.

In some implementations, process 1100 may involve determining the maximum allowable tap spacing value (X) based on a set of latch-up design rules.

In some implementations, the determining of the metal pitch value (Y) may include determining the metal pitch value (Y) by a largest value of a center-to-center distance between any two adjacent metal stripes of the plurality of metal stripes of the global power grid.

Highlights of Select Features

In view of the above, select features of the present disclosure are highlighted below.

In one aspect, a MV CMOS IC may include a plurality of first CMOS cells, a plurality of second CMOS cells, one or more N-wells and one or more ATAPs. Each of the first CMOS cells may have a supply terminal that is configured to receive a local supply voltage. Each of the first CMOS cells may also have an NW terminal that is configured to receive a global supply voltage. The global supply voltage may be different than the local supply voltage. The second CMOS cells may include AON CMOS cells. Each of the second CMOS cells may have a supply terminal that is configured to receive the global supply voltage. Each of the second CMOS cells may also have an NW terminal that is configured to receive the global supply voltage. The NW terminal of at least one of the second CMOS cells and the NW terminal of at least one of the first CMOS cells may be formed in a first N-well of the one or more N-wells. The first N-well may be configured to receive the global supply voltage through the one or more ATAPs disposed in the first N-well.

In some implementations, the plurality of the first CMOS cells and the plurality of the second CMOS cells may be configured to receive the global supply voltage throughout an entire period of operation. In addition, the plurality of the first CMOS cells may be configured to receive the local supply voltage for a portion of, but not the entire, period of operation.

In some implementations, each NW terminal of the plurality of second CMOS cells and each NW terminal of the plurality of first CMOS cells may be disposed in the first N-well.

In some implementations, the one or more N-wells may form a single continuous N-well.

In some implementations, each of the plurality of first CMOS cells may include a p-n junction between the respective supply terminal and the respective NW terminal. In addition, the p-n junction may be reversely biased.

In some implementations, at least one of the plurality of second CMOS cells may be configured to perform a function of a buffer, an inverter, a clock cell, an isolation cell, a tie cell, a power switch header or a level shifter.

In some implementations, a two-dimensional (2D) layout of each of the plurality of second CMOS cells may include an N-well region that extends to two lateral sides of the 2D layout. In addition, each of the two lateral sides of the 2D layout may be configured to abut an adjacent second or first CMOS cell of the plurality of second CMOS cells and the plurality of first CMOS cells without an NW-to-NW spacing between the respective second CMOS cell and the adjacent second or first CMOS cell.

In some implementations, the MV CMOS IC may further include a global power grid. The global power grid may include a plurality of metal stripes each carrying the global supply voltage. In addition, the respective supply terminal of each of the second CMOS cells may be electrically coupled to the global supply voltage through the global power grid.

In some implementations, the MV CMOS IC may further include a semiconductor substrate and one or more stacked power vias. The plurality of first CMOS cells and the plurality of second CMOS cells may be formed on the semiconductor substrate. In addition, when viewing from a direction substantially perpendicular to a main surface of the semiconductor substrate, the one or more ATAPs may be disposed directly under at least one of the plurality of metal stripes of the global power grid. Furthermore, the at least one of the plurality of metal stripes of the global power grid may be coupled to the one or more ATAPs through the one or more stacked power vias.

In some implementations, the one or more ATAPs are disposed in a linear fashion with respect to the global power grid.

In some implementations, the one or more ATAPs are disposed in a staggered fashion with respect to the global power grid.

In another aspect, a method for disposing ATAPs for a MV CMOS IC may involve determining a maximum allowable tap spacing value (X) dictated by a semiconductor technology used to fabricate the MV CMOS IC. The method may also involve determining a metal pitch value (Y) of a plurality of metal stripes of a global power grid according to a physical design of the MV CMOS IC. The method may further involve determining whether X is not smaller than Y. In response to a determination that X is not smaller than Y, the method may involve disposing the ATAPs along and directly under the plurality of metal stripes with a spacing between adjacent ATAPs not larger than X, with other design rules required by the semiconductor technology fulfilled.

In some implementations, in response to a determination that X is smaller than Y, the method may further involve disposing each of the ATAPs with a distance from one or more adjacent ATAPs not larger than X and with other design rules required by the semiconductor technology fulfilled In some implementations, the ATAPs may be disposed in a linear fashion with respect to the global power grid.

In some implementations, the ATAPs may be disposed in a staggered fashion with respect to the global power grid.

In some implementations, the maximum allowable tap spacing value (X) may be dictated based on a set of latch-up design rules.

In some implementations, the determining of the metal pitch value (Y) may include determining the metal pitch value (Y) by a largest value of a center-to-center distance between any two adjacent metal stripes of the plurality of metal stripes of the global power grid.

Additional Notes

The herein-described subject matter sometimes illustrates different components contained within, or connected with, different other components. It is to be understood that such depicted architectures are merely examples, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected", or "operably coupled", to each other to achieve the desired functionality, and any two components capable of being so associated can also be viewed as being "operably couplable", to each other to achieve the desired functionality. Specific examples of operably couplable include but are not limited to physically mateable and/or physically interacting components and/or wirelessly interactable and/or wirelessly interacting components and/or logically interacting and/or logically interactable components.

Further, with respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

Moreover, it will be understood by those skilled in the art that, in general, terms used herein, and especially in the appended claims, e.g., bodies of the appended claims, are generally intended as "open" terms, e.g., the term "including" should be interpreted as "including but not limited to," the term "having" should be interpreted as "having at least," the term "includes" should be interpreted as "includes but is not limited to," etc. It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to implementations containing only one such recitation, even when the same claim includes the introductory phrases "one or more" or "at least one" and indefinite articles such as "a" or "an," e.g., "a" and/or "an" should be interpreted to mean "at least one" or "one or more;" the same holds true for the use of definite articles used to introduce claim recitations. In addition, even if a specific number of an introduced claim recitation is explicitly recited, those skilled in the art will recognize that such recitation should be interpreted to mean at least the recited number, e.g., the bare recitation of "two recitations," without other modifiers, means at least two recitations, or two or more recitations. Furthermore, in those instances where a convention analogous to "at least one of A, B, and C, etc." is used, in general such a construction is intended in the sense one having skill in the art would understand the convention, e.g., "a system having at least one of A, B, and C" would include but not be limited to systems that have A alone, B alone, C alone, A and B together, A and C together, B and C together, and/or A, B, and C together, etc. In those instances where a convention analogous to "at least one of A, B, or C, etc." is used, in general such a construction is intended in the sense one having skill in the art would understand the convention, e.g., "a system having at least one of A, B, or C" would include but not be limited to systems that have A alone, B alone, C alone, A and B together, A and C together, B and C together, and/or A, B, and C together, etc. It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

From the foregoing, it will be appreciated that various implementations of the present disclosure have been described herein for purposes of illustration, and that various modifications may be made without departing from the scope and spirit of the present disclosure. Accordingly, the various implementations disclosed herein are not intended to be limiting, with the true scope and spirit being indicated by the following claims.

What is claimed is:

1. A multi-voltage (MV) complementary metal oxide semiconductor (CMOS) integrated circuit (IC), comprising:
a plurality of first CMOS cells, each of the plurality of first CMOS cells having a supply terminal configured to receive a local supply voltage of a first voltage level and a N-well (NW) terminal configured to receive a global supply voltage of a second voltage level different than the first voltage level;
a plurality of second CMOS cells, each of the plurality of second CMOS cells having a supply terminal configured to receive the global supply voltage and a NW terminal configured to receive the global supply voltage, the second CMOS cells comprising always-on (AON) cells;
one or more N-wells; and
one or more always-on taps (ATAPs),
wherein a first N-well of the one or more N-wells is biased at the second voltage level by receiving the global supply voltage through the NW terminal of at least one of the plurality of first CMOS cells and the NW terminal of at least one of the plurality if second CMOS cells,
wherein the first N-well is further biased at the second voltage level by receiving the global supply voltage through the one or more ATAPs disposed in the first N-well, and
wherein each of the plurality of first CMOS cells has no terminal other than the NW terminal thereof that receives the global supply voltage.

2. The MV CMOS IC of claim 1, wherein the plurality of the first CMOS cells and the plurality of the second CMOS cells are configured to receive the global supply voltage throughout an entire period of operation, and wherein the plurality of the first CMOS cells are also configured to receive the local supply voltage for a portion of but not the entire period of operation.

3. The MV CMOS IC of claim 1, wherein each NW terminal of the plurality of second CMOS cells and each NW terminal of the plurality of first CMOS cells comprise the first N-well.

4. The MV CMOS IC of claim 3, wherein the one or more N-wells comprise a single continuous N-well.

5. The MV CMOS IC of claim 1, wherein each of the plurality of first CMOS cells comprises a p-n junction between the respective supply terminal and the respective NW terminal, and wherein the p-n junction is reversely biased.

6. The MV CMOS IC of claim 1, wherein at least one of the plurality of second CMOS cells is configured to perform a function of a buffer, an inverter, a clock cell, an isolation cell, a tie cell, a power switch header or a level shifter.

7. The MV CMOS IC of claim 1, wherein a two-dimensional (2D) layout of each of the plurality of second CMOS cells comprise an N-well region extending to two lateral sides of the 2D layout, and wherein each of the two lateral sides of the 2D layout is configured to abut an adjacent second or first CMOS cell of the plurality of second CMOS cells and the plurality of first CMOS cells without an NW-to-NW spacing between the respective second CMOS cell and the adjacent second or first CMOS cell.

8. The MV CMOS IC of claim 1, further comprising:
a global power grid that comprises a plurality of metal stripes carrying the global supply voltage,
wherein the respective supply terminal of each of the second CMOS cells is electrically coupled to the global supply voltage through the global power grid.

9. The MV CMOS IC of claim 8, further comprising:
a semiconductor substrate on which the plurality of first CMOS cells and the plurality of second CMOS cells are formed; and
one or more stacked power vias,
wherein, when viewing from a direction substantially perpendicular to a main surface of the semiconductor substrate, the one or more ATAPs are disposed directly under at least one of the plurality of metal stripes of the global power grid, and
wherein the at least one of the plurality of metal stripes of the global power grid is coupled to the one or more ATAPs through the one or more stacked power vias.

10. The MV CMOS IC of claim 8, wherein the one or more ATAPs are disposed in a linear fashion with respect to the global power grid.

11. The MV CMOS IC of claim 8, wherein the one or more ATAPs are disposed in a staggered fashion with respect to the global power grid.

* * * * *